(12) United States Patent
Upputuri

(10) Patent No.: US 9,236,114 B2
(45) Date of Patent: *Jan. 12, 2016

(54) SENSE AMPLIFIER SCHEME FOR LOW VOLTAGE SRAM AND REGISTER FILES

(71) Applicant: TAIWAN SEMICONDUCTOR MANUFACTURING COMPANY, LTD., Hsinchu (TW)

(72) Inventor: Bharath Upputuri, Santa Clara, CA (US)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/200,602

(22) Filed: Mar. 7, 2014

(65) Prior Publication Data

US 2014/0185369 A1     Jul. 3, 2014

Related U.S. Application Data

(63) Continuation of application No. 13/658,060, filed on Oct. 23, 2012, now Pat. No. 8,705,305, which is a continuation of application No. 12/684,842, filed on Jan. 8, 2010, now Pat. No. 8,315,119.

(60) Provisional application No. 61/155,801, filed on Feb. 26, 2009.

(51) Int. Cl.
| G11C 7/02 | (2006.01) |
| G11C 11/419 | (2006.01) |
| G11C 7/06 | (2006.01) |
| G11C 11/413 | (2006.01) |

(52) U.S. Cl.
CPC .............. *G11C 11/419* (2013.01); *G11C 7/067* (2013.01); *G11C 11/413* (2013.01)

(58) Field of Classification Search
CPC ...... G11C 11/419; G11C 7/067; G11C 11/413
USPC ............... 365/206, 207, 154, 156, 189.15, 365/189.06, 189.08, 189.09, 204
See application file for complete search history.

(56) References Cited

U.S. PATENT DOCUMENTS 6,690,604 B2   2/2004   Hsu et al.
6,836,426 B1   12/2004  Fukushi et al.
(Continued)

FOREIGN PATENT DOCUMENTS

JP     2005-146693    6/2005

OTHER PUBLICATIONS

Copy of OA dated Apr. 24, 2012 from corresponding application No. JP 2010-042803.

*Primary Examiner* — Fernando Hidalgo
(74) *Attorney, Agent, or Firm* — Hauptman Ham, LLP

(57) ABSTRACT

In at least one embodiment, a sense amplifier circuit includes a bit line, a sense amplifier output, a keeper circuit, and a noise threshold control circuit. The keeper circuit is coupled to the bit line and includes an NMOS transistor coupled between a power node and the bit line. The keeper circuit is sized to supply sufficient current to compensate a leakage current of the bit line and configured to maintain a voltage level of the bit line. The noise threshold control circuit is connected to the sense amplifier output and the bit line. The noise threshold control circuit comprises an inverter.

20 Claims, 9 Drawing Sheets

(56) References Cited

U.S. PATENT DOCUMENTS

| | | |
|---|---|---|
| 7,417,469 B2 | 8/2008 | Cheng et al. |
| 7,479,807 B1 * | 1/2009 | Cheng .............................. 326/98 |
| 7,646,228 B1 | 1/2010 | Masleid |
| 2009/0015294 A1 | 1/2009 | Cheng |

* cited by examiner

SENSE AMPLIFIER SCHEME FOR LOW VOLTAGE SRAM AND REGISTER FILES

PRIORITY CLAIM

The present application is a continuation of U.S. application Ser. No. 13/658,060, filed Oct. 23, 2012, which is a continuation of U.S. application Ser. No. 12/684,842, filed Jan. 8, 2010, which claims priority of U.S. Provisional Application 61/155,801 filed Feb. 26, 2009 and issued as U.S. Pat. No. 8,315,119 on Nov. 20, 2012, which are incorporated herein by reference in their entireties.

TECHNICAL FIELD

This present application relates generally to semiconductor devices, and more particularly to memory arrays, and even more particularly to the design and operation of static random access memory (SRAM) arrays and/or register files that use single ended sensing to sense the data in a bit cell.

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a data bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a data bit into a selected SRAM cell or reading a stored data bit from the selected SRAM cell.

A register file is an array of processor registers in a central processing unit (CPU). Integrated circuit-based register files are usually implemented by way of fast SRAMs with multiple ports. Such SRAMs are distinguished by having dedicated read and write ports, whereas ordinary multi-ported SRAMs will usually read and write through the same ports.

With the scale of integrated circuits decreasing, the operation voltages of integrated circuits are reduced and similarly the operation voltages of memory circuits. Accordingly, read and write margins of the SRAM cells, which are used to measure how reliable the data bits of the SRAM cells can be read from and written into, respectively, are reduced. Due to the existence of static noise, the reduced read and write margins may increase the possibility of errors in the respective read and write operations.

For single ended sensing of a memory cell, the precharged local bit-line either stays at the precharged level or it is discharged to ground level depending on the data that is stored in the bit-cell. When the local bit-line is kept floating during the case where the cell does not have the data value to discharge the local bit-line, the leakage from the pass gates (all cells in one column) discharges the local bit-line to zero during low frequency operation, thus making a false sensing. To avoid this false sensing issue, the local bit-line is kept at Vdd through a weak (small current) precharger device, i.e. a "keeper" circuit.

FIG. 1 illustrates a conventional sense amplifier circuit 100 that can be a portion of a SRAM array or register files, and includes a keeper circuit 102. The size of components of the keeper 102 is very critical in order to assure that the bit-cell overpowers the keeper 102 for a normal read operation. The circuit 100 is connected to bit-lines, i.e. top bit-line 108a and bottom bit-line 108b. The precharger 110 charges the local bit-line 108a and 108b to high state according to the control signals 114 when there is no read operation. During manufacturing of the memory as disclosed in FIG. 1, there are acceptable variations in performance parameters. Process corners refer to integrated circuits with lowest and/or highest desirable performance parameters. Skew corners refer to integrated circuits with both lowest and highest desirable performance parameters in their sub-circuits. At low voltages, and skew corners (e.g. slow array transistors in bit-line 108a or 108b and fast periphery transistors in a keeper 102), the bit-cell connected to the bit-line 108a or 108b will not be able to overpower this keeper 102. Therefore, there is a limitation on the lowest desirable power supply voltage, i.e. Vdd_min, for the circuit to operate without error.

One way to make this circuit 100 work properly under low voltage is to increase the resistance of the keeper 102, such as increasing the channel length of the keeper transistor 104 or decreasing the width of the same. This will make the keeper 102 easier to be overcome by the bit-cell connected to the bit-line 108a or 108b. However, this method has its limits due to the area that the keeper transistor 104 occupies and also the current flow level necessary for the keeper 102 to provide the leakage current from the pass gates and thus make it operational.

Another way to make the circuit 100 operational under low voltage is to make the trip point voltage of the NAND gate 106 higher, where the trip point is the highest voltage where the sense amplifier output switches from a high level to a low level. For that purpose, for example, when the NAND gate 106 comprises NMOS and PMOS, the value of $\beta$ of the NAND gate 106 can be increased, where $\beta$ is the ratio of Wp/Wn, and Wp and Wn are the gate widths of PMOS transistor and NMOS transistor, respectively. This ratio $\beta$ determines the trip point in CMOS circuits. However, this will make the circuit 100 susceptible to noise closer to the high state voltage because the trip point is higher. For example, when there is noise in the bit-line 108a or 108b close to a high state, the output voltage could be lowered by the noise below the trip point of the NAND gate 106, which triggers an erroneous operation.

Therefore, methods to avoid false sensing the local bit-line under low voltage for SRAM and/or register files are desired.

SUMMARY

In one embodiment, a sense amplifier circuit includes a bit line, a sense amplifier output, a keeper circuit, and a noise threshold control circuit. The keeper circuit is coupled to the bit line and includes an NMOS transistor coupled between a power node and the bit line. The keeper circuit is sized to supply sufficient current to compensate a leakage current of the bit line and configured to maintain a voltage level of the bit line. The noise threshold control circuit is connected to the sense amplifier output and the bit line. The noise threshold control circuit comprises an inverter.

In another embodiment, a sense amplifier circuit includes a bit line, a sense amplifier output, a keeper circuit, a logic inverter, and a noise threshold control circuit. The keeper circuit is coupled to the bit line and includes a first NMOS transistor coupled between a first power node and the bit line. The keeper circuit is sized to supply sufficient current to compensate a leakage current of the bit line and configured to maintain a voltage level of the bit line. The logic inverter has an input node and an output node. The input node is coupled to the bit line and the output node is coupled to the sense amplifier output. The noise threshold control circuit is connected to the sense amplifier output. The noise threshold control circuit is configured to have greater driving capability to pull a voltage level of the sense amplifier output toward that of a second power node than to pull the voltage level of the sense amplifier output toward that of the first power node.

In yet another embodiment, a sense amplifier circuit includes a data line, a sense amplifier output, a keeper circuit, and a noise resistant gate. The keeper circuit comprises a first transistor and a second transistor connected in series and coupled between a first power node and the data line. A gate of the first transistor is coupled to the sense amplifier output. The noise resistant gate comprises an input node coupled to the data line and an output node coupled to the sense amplifier output. The noise resistant gate is configured to have greater driving capability to pull a voltage level of the sense amplifier output toward that of a second power node than to pull the voltage level of the sense amplifier output toward that of the first power node.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The circuits of the presently preferred embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure. A skilled person will appreciate alternative implementations.

Figure 2:
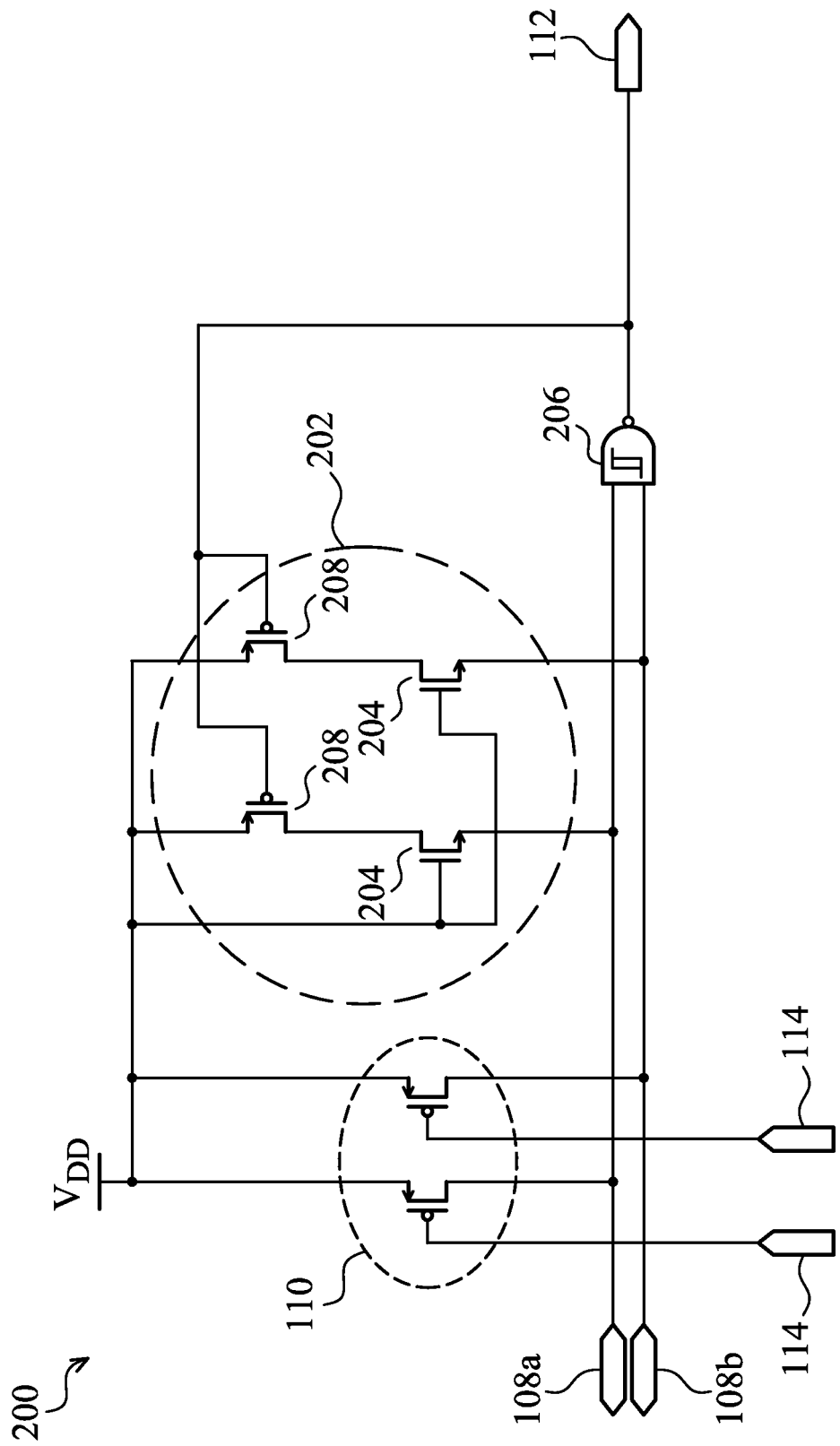
FIG. 2 is a schematic diagram of a sense amplifier circuit according to one embodiment of the present disclosure.

FIG. 2 is a schematic diagram of a sense amplifier circuit 200 according to one embodiment of the present invention. The sense amplifier circuit 200 has a keeper circuit 202. The circuit 200 is connected to bit-lines, i.e. top bit-line 208a and bottom bit-line 208b. The precharger 210 charges the local bit-line 208a and 208b to a high state according to the control signals 214 when there is no reading operation.

Further, the keeper circuit 202 has NMOS transistors 204 and a noise resistant NAND gate 206. In this particular example, the gate node of the NMOS transistor 204 in the keeper circuit 202 is connected to the power supply node and its source node is connected to the bit line. The drain node of the NMOS transistor 204 is connected to the power supply node through a PMOS transistor. The NMOS 204 is only in sub-threshold until the bit-line read voltage reaches $V_{dd}$-$V_T$, where $V_T$ is the threshold voltage of the transistor, thus effectively making the keeper circuit 202 weaker, i.e. easier to be overcome by the bit-line as its voltage decreases. In one embodiment, the noise resistant NAND gate 206 (or a noise threshold control circuit) is a half-Schmitt trigger; in another embodiment, the noise resistant NAND gate 206 is a Schmitt trigger as depicted in FIG. 2. However, in alternative embodiments, alternative circuits may be formed by rearranging the devices so that the 13 ratio is decreased or the trip point is lowered.

Figure 3:
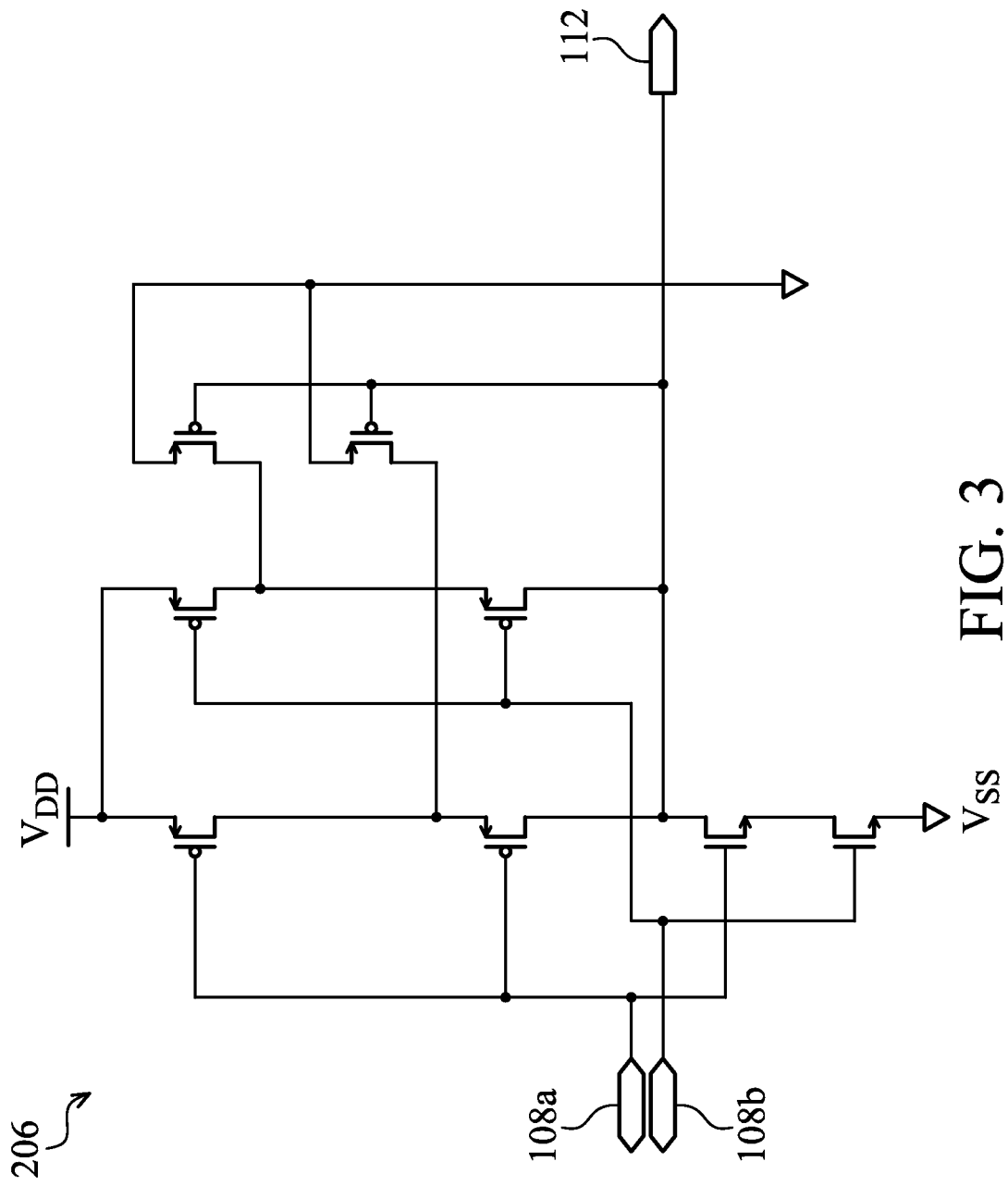
FIG. 3 is a schematic diagram of a half-Schmitt trigger circuit for used as an exemplary noise threshold control circuit 206 in FIG. 2.

FIG. 3 is a schematic diagram of one example of the noise threshold control circuit 206 as indicated by NAND gate symbol in FIG. 2, using a half-Schmitt trigger circuit.

By lowering the trip point of the sense amplifier out, it is possible to use a lower precharge voltage level on the bit-line and avoid false sensing of the bit-line read. The trip point is the highest voltage where the sense amplifier output switches from a high level to a low level. The response time of the bit-line to output is reduced because of the improved bit-line slope of the new circuit design. The response time of the sense amplifier output is faster due to the new scheme. Further, in at least some embodiments, the local bit-line is precharged to $V_{dd}$-$V_T$, instead of $V_{dd}$.

The keeper circuit 204 using NMOS transistors as shown in FIG. 2 make the keeper circuit 202 effectively weaker, i.e. easier to overcome by the bit-line. However, this in turn can make the prior art circuit susceptible to noise when there are voltage fluctuations on the bit-line 108a or 108b. To avoid the noise susceptibility, a noise threshold control circuit 206, e.g. a half-Schmitt trigger or a Schmitt trigger circuit is used in place of the prior art NAND gate 106. This scheme makes it possible to perform the bit-line read operation without false sensing at lower power voltage by having a lower trip point.

Figure 4:
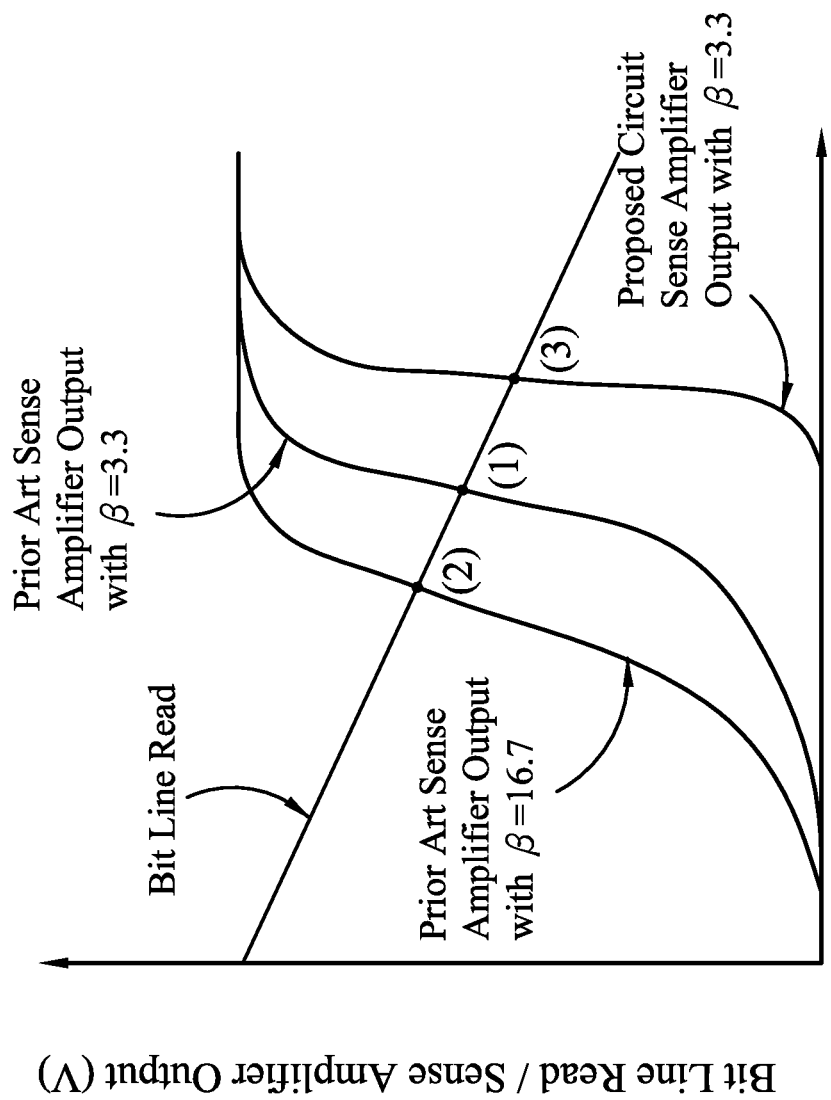
FIG. 4 is a graph of the output of the bit-line read/sense amplifier/read showing a trip point or the voltage at which the sense amplifier receiver switches with the same bit-line slope for (1) a prior art circuit with $\beta=3.3$, (2) a prior art circuit with $\beta=16.7$, and (3) a proposed circuit according to one embodiment of the disclosure with $\beta=3.3$.

FIG. 4 is a graph of the trip point or the voltage at which the sense amplifier receiver switches with the same bit-line slope for (1) a prior art circuit with $\beta=3.3$, (2) a prior art circuit with $\beta=16.7$, and (3) a proposed circuit with $\beta=3.3$. The bit-line read plot is based on the prior art circuit 100 shown in FIG. 1. In FIG. 4, the prior art circuit 100 with $\beta=3.3$ has the trip point at point (1). The prior art circuit 100 with $\beta=16.7$ has the trip point at point (2). The purpose of increased $\beta$ is to make the keeper circuit 102 weaker so that the bit-line read can overcome the keeper circuit 102 at lower power supply voltage. As shown in FIG. 4, the trip point (2) is higher than trip point (1). In one circuit simulation under the power supply voltage of 0.7V according to one of the embodiments, the difference is about 34 mV. However, by increasing the trip point, the sense amplifier output is susceptible to the bit line read voltage fluctuations caused by noise. This makes the prior art circuit difficult to operate at lower voltage. In comparison, the proposed circuit 200 with β=3.3 according to one of the embodiments has trip point at point (3). The trip point (3) is lower than (1) or (2). In the simulation under the power supply voltage of 0.7V, the difference between (3) and (1) is about 77 mV, and the difference between (3) and (2) is about 111 mV. This makes the proposed circuit easier to operate at lower voltage. Also, in another simulation with the power supply voltage of 0.6V, both sense amplifier circuits according to prior art do not work at all, i.e. the sense amplifier outputs do not switch when the bit-line voltage dropped, while the proposed circuit operates properly.

Figure 1:
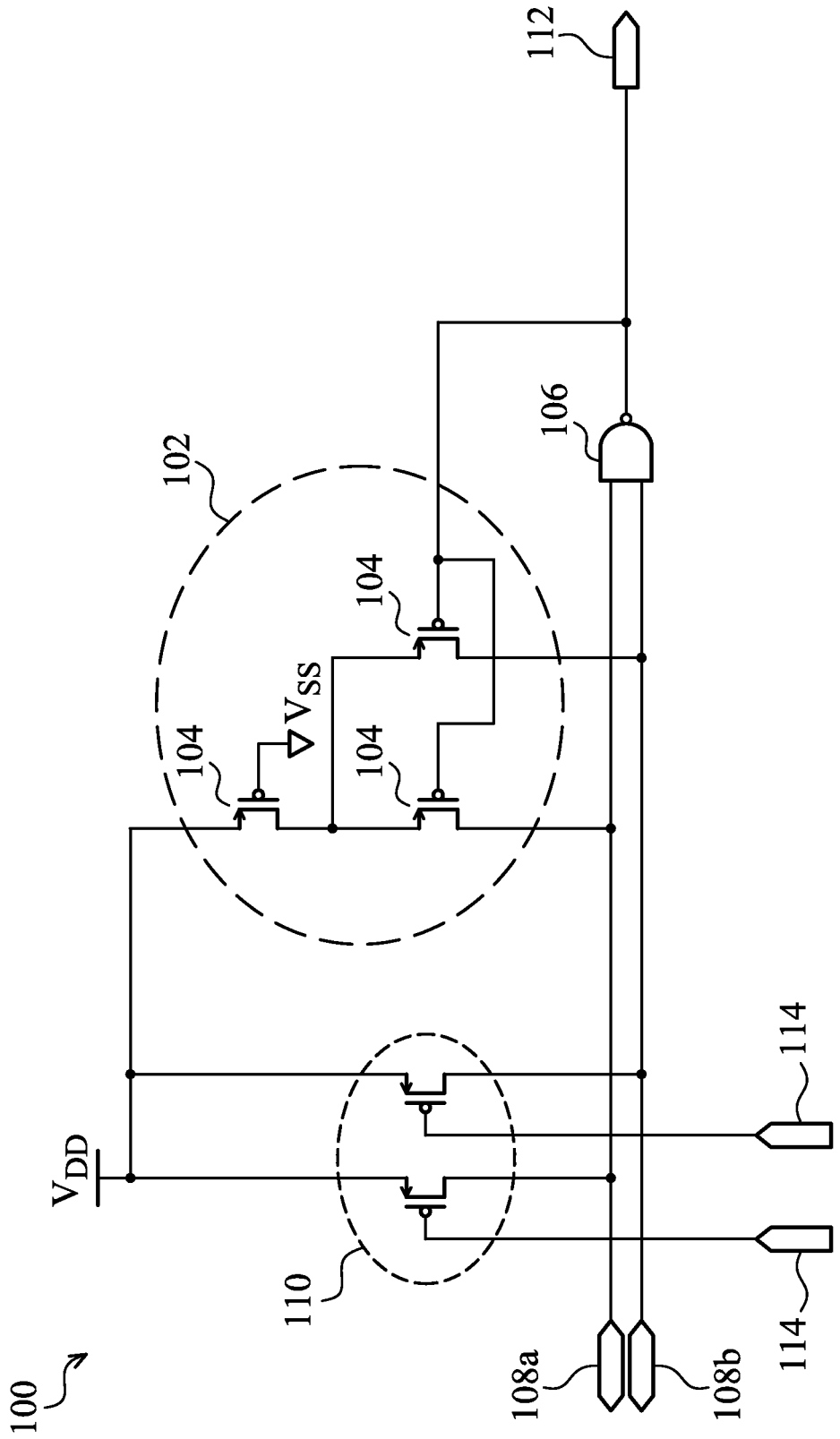
FIG. 1 is a schematic diagram of a conventional sense amplifier circuit.
Figure 5:
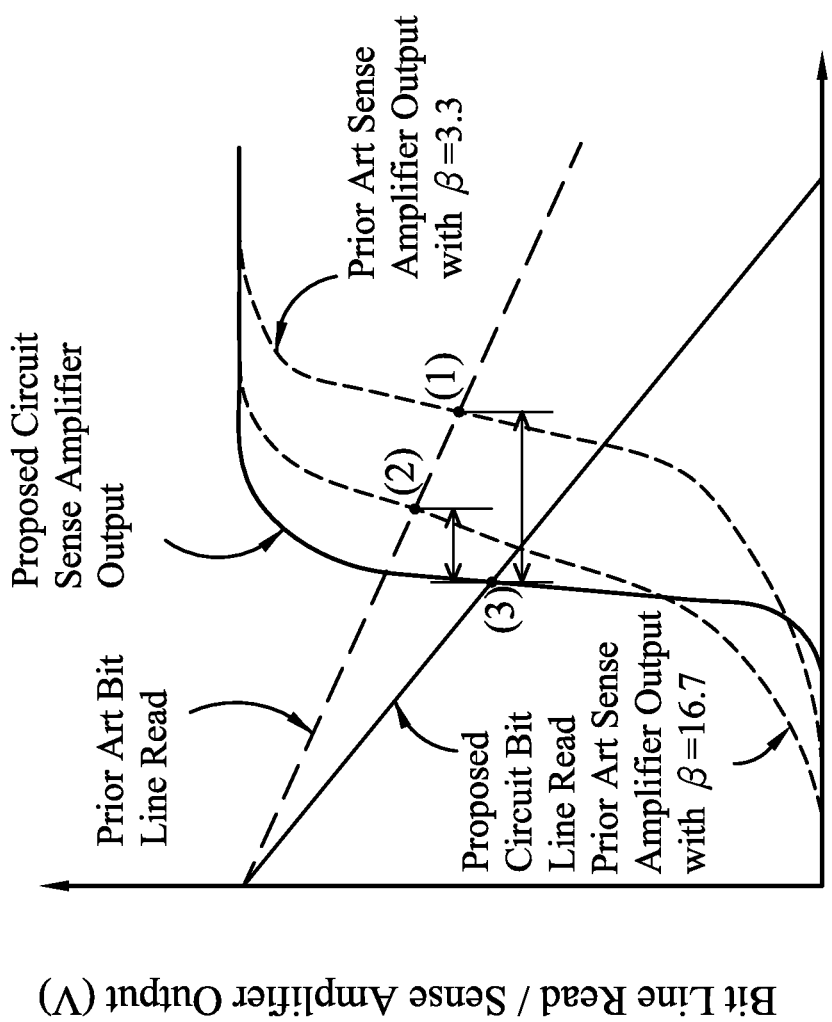
FIG. 5 is a graph of the output of the bit-line read/sense amplifier/read showing the bit-line slopes for (1) a prior art circuit with $\beta=3.3$, (2) a prior art circuit with $\beta=16.7$, and (3) a proposed circuit according to one embodiment of the disclosure with $\beta=3.3$, with different bit-line voltage lines for prior art circuit and the proposed circuit.

FIG. 5 is a graph of the output of the bit-line read/sense amplifier/read showing the bit-line slopes for (1) a prior art circuit with β=3.3, (2) a prior art circuit with β=16.7, and (3) a proposed circuit with β=3.3, with different the bit-line voltage lines for prior art circuit and the proposed circuit. FIG. 5 shows a separate bit-line read voltage plot for the circuit 200 according to one of the embodiments. The same bit-line read voltage based on the prior art circuit 100 shown in FIG. 1 is shown to facilitate understanding. As shown, the prior art circuit with β=16 has a shorter response time (the time where the trip point (2) is positioned) compared to the response time of point (1) of the prior art circuit 100 with β=3.3. However, the proposed circuit response time (the time where the trip point (3) is positioned) is even shorter than the prior art with β=16.7 (the time where the trip point (2) is positioned). In one simulation under the power supply voltage of 0.7V, the difference between (3) and (1) is about 0.9 ns, while the difference between (3) and (2) is about 0.2 ns.

Figure 6:
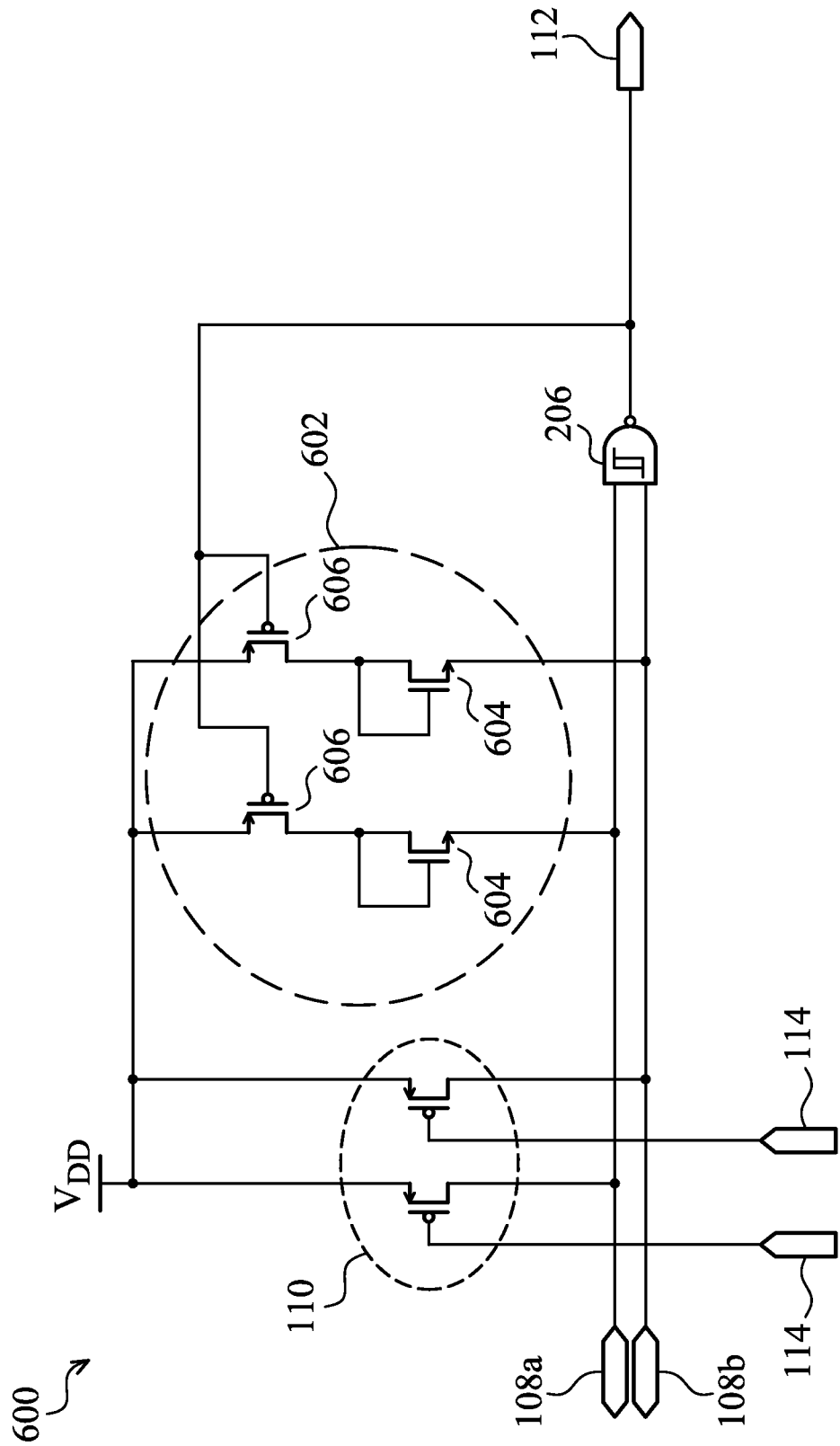
FIG. 6 is a schematic diagram of another embodiment of the sense amplifier circuit according to one aspect of the present disclosure.

FIG. 6 is a schematic diagram of another embodiment of the sense amplifier circuit 600 according to the present disclosure. In this embodiment, the NMOS 604 transistor in the keeper circuit 602 is configured as a diode by connecting its gate and drain node of the NMOS transistor 604. The drain node of the NMOS transistor 604 is connected to the power supply node Vdd through a PMOS transistor 606. The source node of the NMOS transistor 604 is connected to the bit line 208a and/or 208b.

Figure 7A:
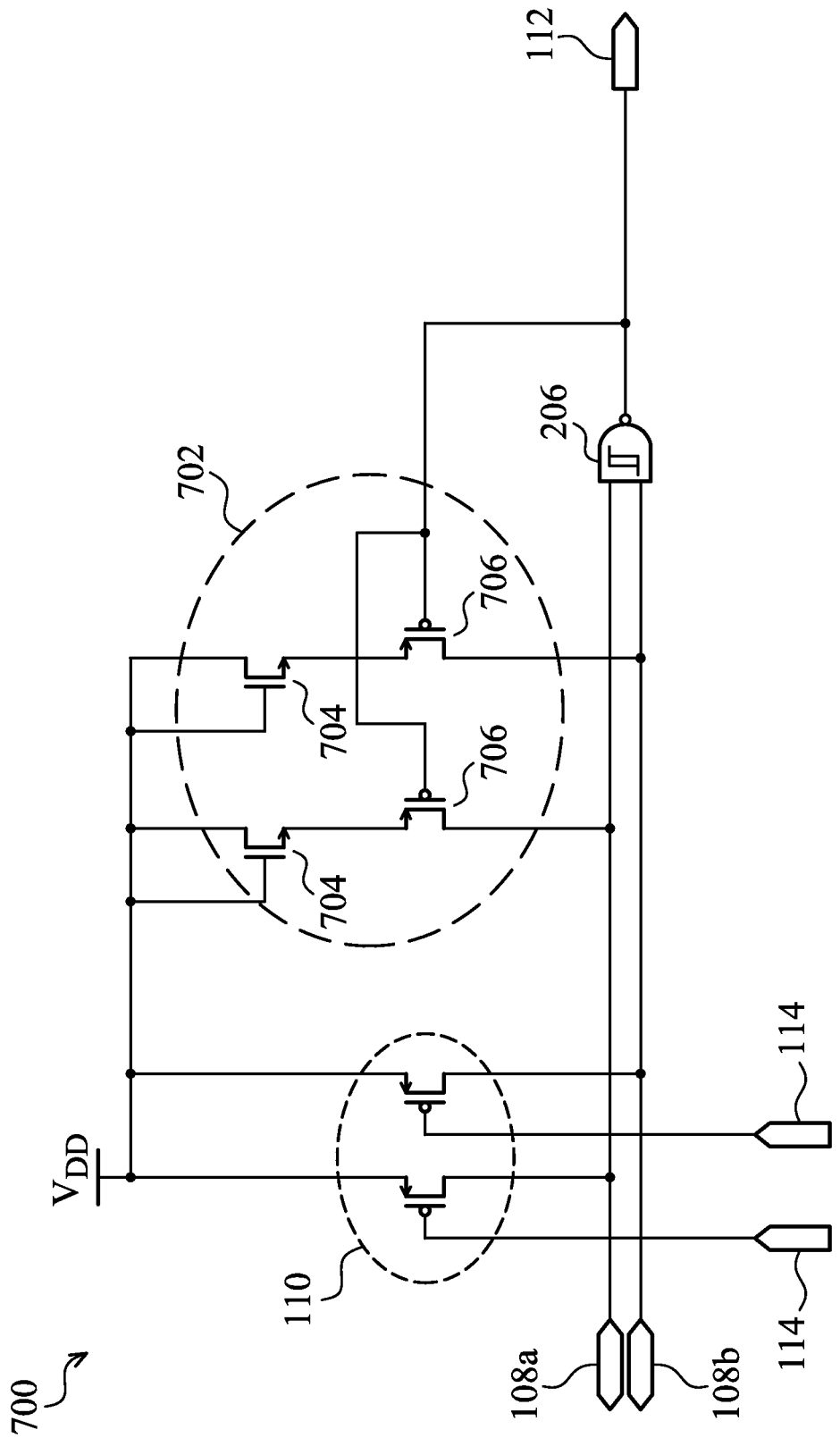
FIG. 7A is a schematic diagram of yet another embodiment of the sense amplifier circuit according to the present disclosure.

FIG. 7A is a schematic diagram of yet another embodiment of the sense amplifier circuit 700 according to the present invention. In this embodiment, the gate and drain node of the NMOS transistor 704 in the keeper circuit 702 are connected to the power supply node Vdd and its source node is connected to the bit line 208a and/or 208b through a PMOS transistor 706.

Figure 7B:
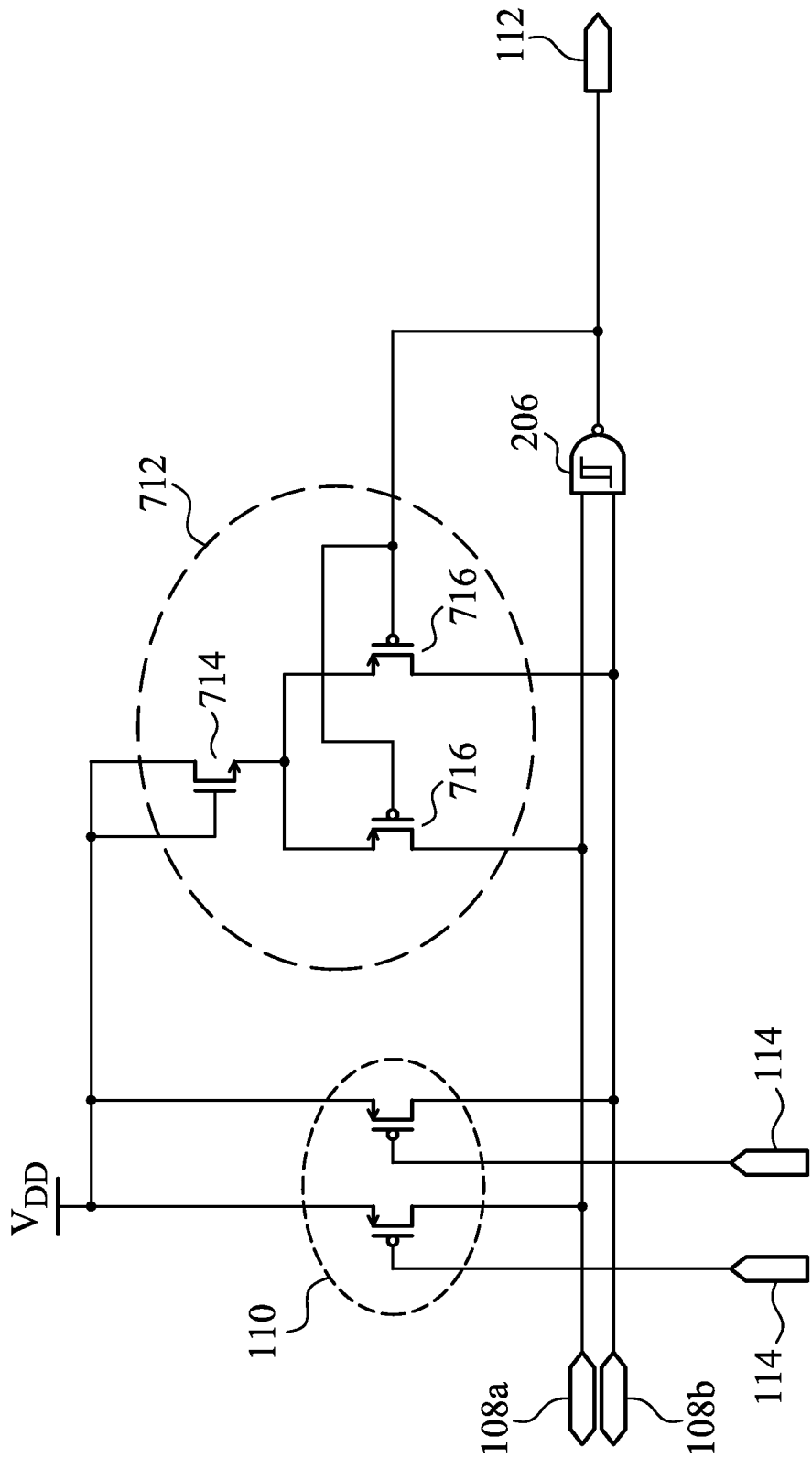
FIG. 7B is a schematic diagram of an variation of the sense amplifier circuit according to the embodiment depicted in FIG. 7A.

FIG. 7B is a schematic diagram of a variation of the sense amplifier circuit show in FIG. 7A. In this embodiment, the gate and drain node of the NMOS transistor 714 in the keeper circuit 712 are connected to the power supply node Vdd and its source node is connected to the bit line 108a and/or 108b through a PMOS transistor 716.

Figure 8:
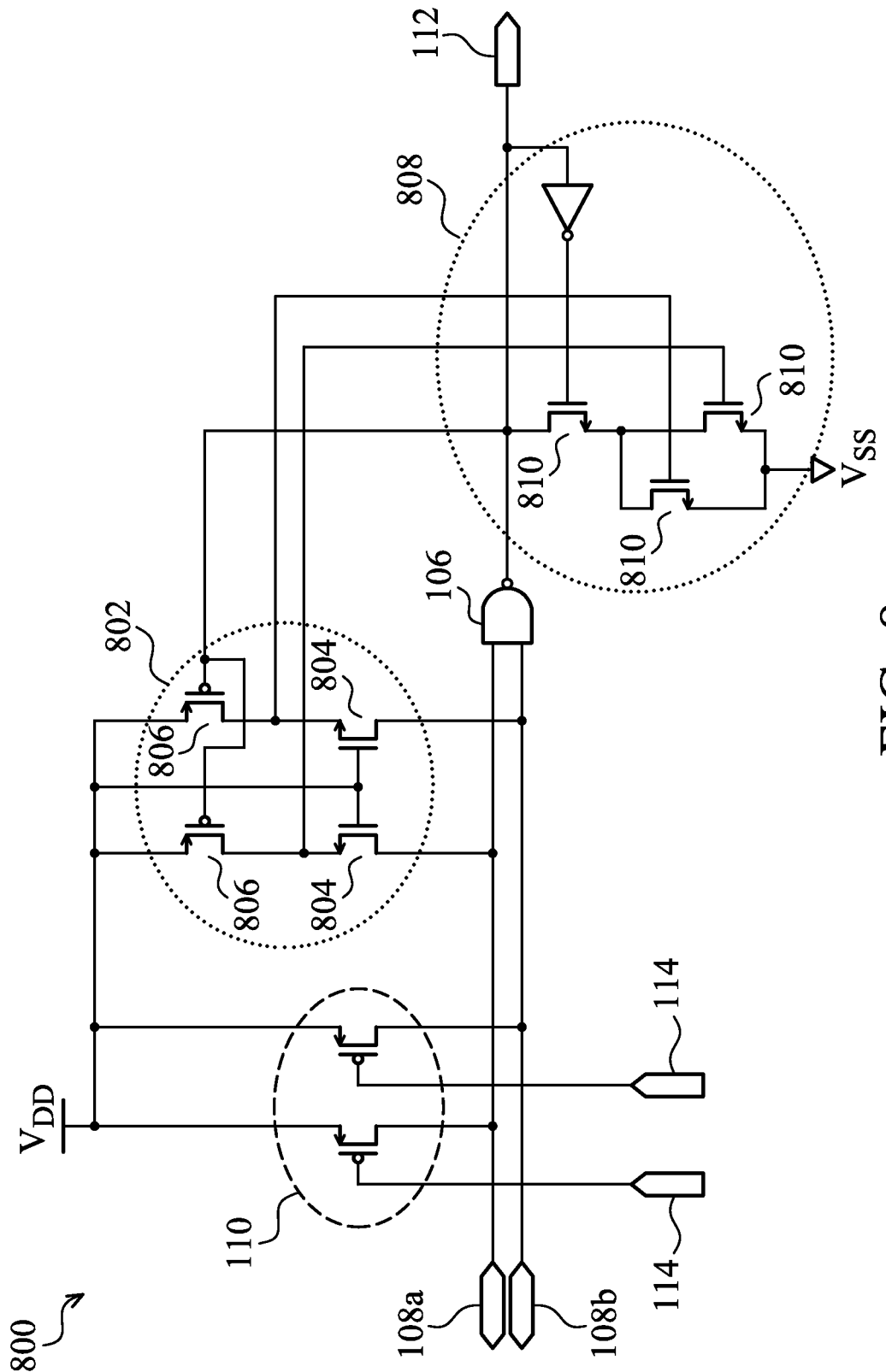
FIG. 8 is a schematic diagram of yet another embodiment of the sense amplifier circuit according to the present disclosure.

FIG. 8 is a schematic diagram of yet another embodiment of the sense amplifier circuit 800 according to the present disclosure. In this embodiment, the source node of the NMOS transistor 804 in the keeper circuit 802 is connected to the power supply node through a PMOS transistor 806 and its drain node is connected to the bit line 208a and/or 208b. The gate node of the NMOS transistor 804 is connected to the power supply node Vdd. According to this embodiment, the noise threshold control circuit 808 including strong NMOS transistors 810 are connected in parallel to conventional NAND gate 206 to lower the trip point of the sense amplifier output 212 by effectively lowering the value of β of the NAND gate 206.

Although the present invention and its advantages have been described in detail, it should be understood that various changes, substitutions and alterations can be made herein without departing from the spirit and scope of the invention as defined by the appended claims. For example, a single bit line circuit instead of a pair of bit-line circuit as shown in FIGS. 2-3, 6-9 can use an inverter with a single input and output instead of NAND gates with two inputs.

Moreover, the scope of the present application is not intended to be limited to the particular embodiments of the invention described in the specification. As one of ordinary skill in the art will readily appreciate from the disclosure of the present invention, any development, presently existing or later to be developed, that perform substantially the same function or achieve substantially the same result as the corresponding embodiments described herein may be utilized according to the present invention. Accordingly, the appended claims are intended to include within their scope such developments.

What is claimed is:

1. A sense amplifier circuit comprising:
   a bit line;
   a sense amplifier output;
   a keeper circuit coupled to the bit line, the keeper circuit including an NMOS transistor coupled between a power node and the bit line, wherein the keeper circuit is sized to supply sufficient current to compensate a leakage current of the bit line and configured to maintain a voltage level of the bit line; and
   a noise threshold control circuit connected to the sense amplifier output and the bit line, wherein the noise threshold control circuit comprises an inverter.

2. The sense amplifier circuit of claim 1, wherein a drain node of the NMOS transistor is coupled to the power node through a PMOS transistor.

3. The sense amplifier circuit of claim 1, wherein a gate node of the NMOS transistor is coupled to the power node.

4. The sense amplifier circuit of claim 3, wherein the gate node of the NMOS transistor is coupled to the power node through a PMOS transistor.

5. The sense amplifier circuit of claim 1, wherein a source node of the NMOS transistor is coupled to the bit line through a PMOS transistor.

6. The sense amplifier circuit of claim 1, wherein a gate node of the NMOS transistor is coupled to a source node of the NMOS transistor.

7. The sense amplifier circuit of claim 1, wherein the gate node of the PMOS transistor is coupled to the sense amplifier output.

8. The sense amplifier circuit of claim 1, wherein the inverter comprises a half-Schmitt trigger circuit or a Schmitt trigger circuit.

9. The sense amplifier circuit of claim 1, further comprising a PMOS transistor, wherein a beta ratio of a PMOS transistor gate width to an NMOS transistor gate width is about 3.3.

10. A sense amplifier circuit comprising:
    a bit line;
    a sense amplifier output;
    a keeper circuit coupled to the bit line, the keeper circuit including a first NMOS transistor coupled between a first power node and bit line, wherein the keeper circuit is sized to supply sufficient current to compensate a leakage current of the bit line and configured to maintain a voltage level of the bit line;
    an inverter having an input node coupled to the bit line and an output node coupled to the sense amplifier output; and
    a noise threshold control circuit connected to the sense amplifier output, wherein the noise threshold control circuit is configured to have greater driving capability to pull a voltage level of the sense amplifier output toward that of a second power node than to pull the voltage level of the sense amplifier output toward that of the first power node.

11. The sense amplifier circuit of claim 10, wherein the noise threshold control circuit comprises:
   a second NMOS transistor coupled between the sense amplifier output and the second power node, the second NMOS transistor being configured to be turned off or on in response to a voltage level at the sense amplifier output; and
   a third NMOS transistor coupled between the second NMOS transistor and the second power node, and a gate of the third NMOS transistor is coupled to the keeper circuit.

12. The sense amplifier circuit of claim 11, wherein the first NMOS transistor is coupled to the first power node through a PMOS transistor, and the gate of the third NMOS transistor is coupled to the drain of the PMOS transistor.

13. The sense amplifier circuit of claim 10, wherein a gate node of the first NMOS transistor is coupled to the first power node.

14. The sense amplifier circuit of claim 10, wherein the gate node of the PMOS transistor is coupled to the sense amplifier output.

15. A sense amplifier circuit comprising:
   a data line;
   a sense amplifier output;
   a keeper circuit comprising a first transistor and a second transistor connected in series and coupled between a first power node and the data line, a gate of the first transistor is coupled to the sense amplifier output; and
   a noise resistant inverter, resistant to high state and low state noise on the data line, the noise resistant inverter comprising an input node coupled to the data line and an output node coupled to the sense amplifier output, wherein the noise resistant inverter is configured to have greater driving capability to pull a voltage level of the sense amplifier output toward that of a second power node than to pull the voltage level of the sense amplifier output toward that of the first power node.

16. The sense amplifier circuit of claim 15, wherein the first transistor is a PMOS transistor, and the second transistor is an NMOS transistor.

17. The sense amplifier circuit of claim 16, wherein a source of the first transistor is connected to the first power node, a drain of the first transistor is connected to a drain of the second transistor, and a source of the second transistor is connected to the data line.

18. The sense amplifier circuit of claim 17, wherein a gate of the second transistor is connected to the drain of the second transistor.

19. The sense amplifier circuit of claim 16, wherein a drain and a gate of the second transistor is connected to the first power node, a source of the second transistor is connected to a source of the first transistor, and a drain of the first transistor is connected to the data line.

20. The sense amplifier circuit of claim 16, wherein a beta ratio of a gate width of the PMOS transistor to a gate width of the NMOS transistor is about 3.3.

* * * * *